(12) United States Patent
Lee et al.

(10) Patent No.: US 6,482,521 B1
(45) Date of Patent: Nov. 19, 2002

(54) STRUCTURE WITH BLENDED POLYMER CONFORMAL COATING OF CONTROLLED ELECTRICAL RESISTIVITY

(75) Inventors: Chris Lee, Santa Monica, CA (US); Lynn E. Long, Manhattan Beach, CA (US); Philip L. Leung, La Canada, CA (US)

(73) Assignee: Hughes Electronics Corp., Los Angeles, CA (US)

( * ) Notice: Subject to any disclaimer, the term of this patent is extended or adjusted under 35 U.S.C. 154(b) by 9 days.

(21) Appl. No.: 09/629,026

(22) Filed: Jul. 31, 2000

(51) Int. Cl.[7] .............................................. B32B 27/38
(52) U.S. Cl. .................... 428/413; 428/423.1; 428/447; 428/522; 252/500; 252/511
(58) Field of Search ............................ 428/413, 423.1, 428/447, 522; 252/500, 511

(56) References Cited

U.S. PATENT DOCUMENTS 5,160,374 A * 11/1992 Frederickson ............... 106/401
6,287,691 B1 * 9/2001 Decaumont .................. 428/379
6,312,621 B1 * 11/2001 Pedigo ......................... 252/500
6,315,926 B1 * 11/2001 Jansen ......................... 252/500
6,323,543 B1 * 11/2001 Jiang ........................... 257/676
6,326,441 B1 * 12/2001 Koul ............................ 525/540

* cited by examiner

Primary Examiner—Leszek Kiliman
(74) Attorney, Agent, or Firm—John R. Rafter; Terje Gudmestad

(57) ABSTRACT

A conformally coated structure includes a component of an electronic assembly, such as a microelectronic device, a part of a package, or an electrically conductive trace, and a conformal coating applied to a surface of the structure. The conformal coating is a cured polymer blend of a base polymer and an electrically conductive polymer. The polymer blend has an electrical resistivity of from about $10^9$ to about $10^{13}$ ohm-centimeter. The polymer blend contains from about 0.5 percent to about 4 percent by weight of the electrically conductive polymer, with the remainder the base polymer. The electrically conductive polymer may be a polyaniline, and the base polymer may be a urethane.

25 Claims, 3 Drawing Sheets

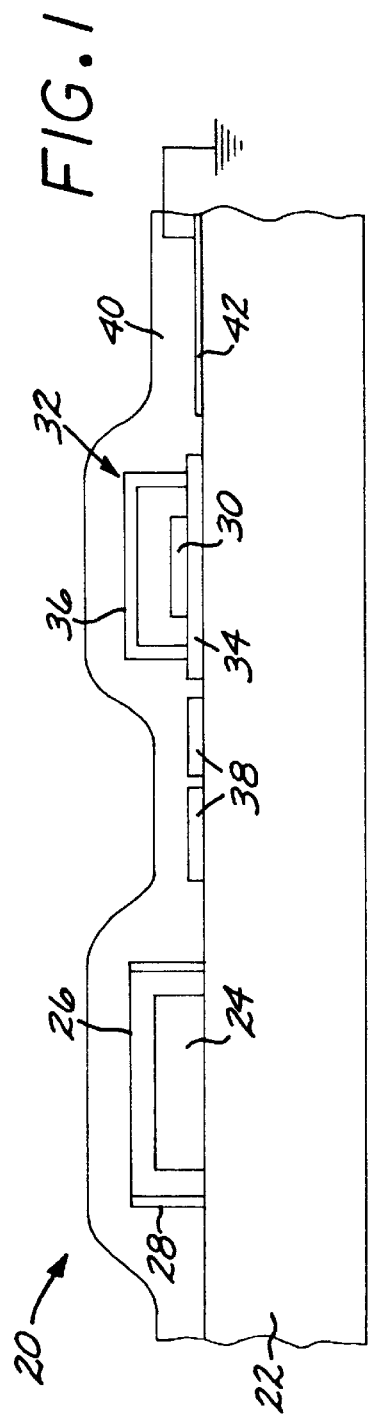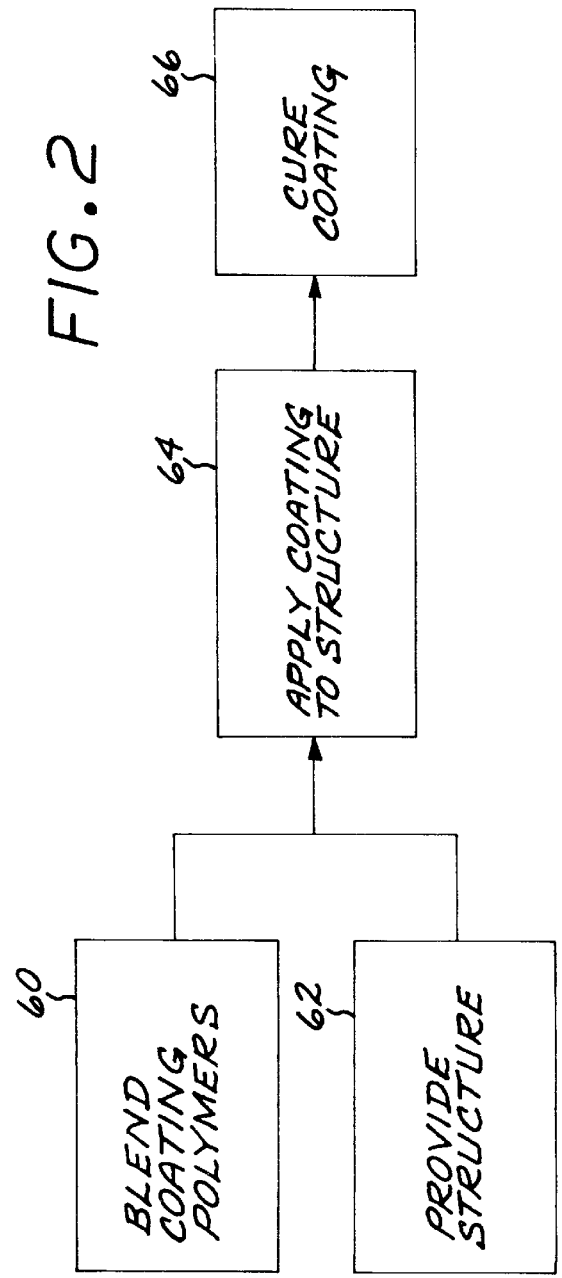

STRUCTURE WITH BLENDED POLYMER CONFORMAL COATING OF CONTROLLED ELECTRICAL RESISTIVITY

BACKGROUND OF THE INVENTION

In one widely used architecture, the circuit components of an electronic device are supported on a printed wiring board (PWB) or printed circuit board. The components include, for example, microelectronic devices, packages, and electrically conductive traces. These circuit components may be fragile and/or easily damaged by environmental agents such as chemicals, dirt, and contact with foreign objects. The circuit components are therefore protected from such damage.

One protective approach is a conformal coating. The conformal coating is typically a curable polymer that is applied as an uncured liquid to the individual circuit component or to the entire PWB by dipping, spraying, brushing, screening, or other approach, and thereafter cured. The cured conformal coating encapsulates and seals the coated structure against intrusion of environmental agents, and also provides an insulating barrier between the components and exterior shorts. A commonly used conformal coating is polyurethane.

Another potential source of damage to electronic structures used in spacecraft is the accumulation of electronic charge on the surfaces of the structures. The space environment has a flux of energetic electrons from the solar wind and other sources. These electrons may penetrate spacecraft shielding and accumulate on the surfaces of the electronic devices as static charges. When the static charges accumulate to the extent that they become sufficiently high in voltage, they may discharge uncontrollably by arcing and cause damage to the electronic structure.

Preferably, to protect against such uncontrolled discharge events, the conducting surfaces of electronic components should be grounded by leads extending to a common ground. As for the non-conductive surfaces of electronic components, the ideal solution is to cover these surfaces with a grounded and conductive coating. However, the conductive coating must have the proper electrical conductivity so that the coating does not cause excessive current to flow between electronic components leading to degradation in performance of circuits, or in the extreme case, shorting of circuits. It may be difficult to ground all of the electronic structures, and it is almost always quite expensive to do so.

In an alternative approach disclosed in U.S. Pat. No. 5,160,374, about 60 percent by volume of electrically conductive tin oxide particles are mixed into a resin material to form a paint. The paint is applied over the electronic structures as a conformal coating. The paint has an electrical resistivity of about $10^6$–$10^{12}$ ohm-centimeter. The paint thus has some electrical conductivity, so that static charge is drained away, but also serves as a semi-insulator. The approach of the '374 patent is operable to some degree, but the present inventors have recognized that it has significant drawbacks in many applications. First, the resistivity is too low leading to excessive leakage current. Second, the properties of the paint are dominated by the high volume fraction of the particles, so that the mechanical integrity and protective quality of the conformal coating are compromised. The particles may form a shorting bridge between closely spaced elements of the electronic structure, such as circuit traces on a die. Further, the paint is largely opaque, and visual inspection of the electronic components underneath the paint is difficult if not impossible.

Consequently, there is a need for an improved approach to the protection of electronic structures. The present invention fulfills this need, and further provides related advantages.

SUMMARY OF THE INVENTION

The present invention provides a conformally coated structure wherein the conformal coating encapsulates the structure and protects it against mechanical and chemical damage. The conformal coating also protects the structure against the buildup of static electrical charges, but also provides shorting protection. Its electrical resistivity remains nearly constant over a wide range of temperatures, an important consideration for aircraft and spacecraft conformal coatings. The conformal coating has excellent mechanical integrity, substantially the same as that of conventional (nonconductive) conformal coatings, and is readily applied. There is no danger of shorting between closely spaced structures through the conformal coating. The protection against static charges is accomplished at low cost by the application of the conformal coating, reducing the labor costs associated with conventional grounding procedures. The conformal coating may be reworked after application by solvent removal.

In accordance with the invention, a conformally coated structure comprises a structure and a conformal coating applied to the structure. The conformal coating comprises a polymer blend of a base polymer and an electrically conductive polymer. The structure typically comprises a component of an electronic assembly such as a microelectronic device, a part of an electronic package, or an electrically conductive trace. The conformal coating is preferably applied in an uncured state, and then cured. The electrically conductive polymer is preferably a polyaniline such as an acid-doped polyaniline, and the base polymer is preferably a urethane, an epoxy, a silicone, or an acrylic.

The electrical resistivity of the polymer blend is preferably from about $10^9$ to about $10^{13}$ ohm-centimeter. This resistivity is sufficiently high to prevent shorting between adjacent components and between components and external objects. This resistivity is sufficiently low to permit accumulated static electrical charges deposited upon the surface of the structure to be slowly conducted to ground in a carefully controlled discharge, before they can accumulate to such a degree that there is danger of an uncontrolled discharge event such as an arc or other disruption of the protected electronic components.

The value of the electrical resistivity of the conformal coating is determined by the relative proportions of the electrically conductive polymer and the base polymer. A blend containing about 0.5 percent to about 4 percent by weight of the electrically conductive polymer, with the remainder of the blend comprising the base polymer, results in an electrical resistivity that is suitable.

The electrical resistivity is nearly constant over a wide range of temperatures, including the temperature range of −80° C. to +80° C. encountered in many spacecraft applications. They may accomplish this constancy of electrical resistivity only with the present approach. The use of polymers filled with metal oxide, carbon, and/or other particulate fillers results in a much wider variability of the electrical resistivity of the conformal coating over such a temperature range. In the particle-filled conformal coatings, the conformal coating is more conductive at colder temperatures as the coating shrinks and particles become closer together, and less conductive at higher temperatures as the coating expands and the particles move farther apart. The polymeric filler of the present invention resists these changes in electrical resistivity as the temperature changes.

The low percentage of the electrically conductive polymer in the blend has the important consequence that the mechanical and protective properties of the conformal coating are essentially those of the base polymer. The conformal coating is therefore applied by the same techniques as used for the base polymer and cured substantially as recommended for the base polymer. The integrity of the conformal coating is substantially the same as that of the base polymer. The conformal coating protects the coated structure from mechanical and chemical intrusion as does the base polymer. Thus, the conformal coating of the invention has properties like those of a conformal coating of the base polymer, but with the added benefit of reducing static charges before they can accumulate to the degree that an uncontrolled discharge may occur or there is other damage to electronic components.

The present approach also offers the opportunity for inspection of the underlying structure through the conformal coating in some circumstances. At a conductive polymer concentration of from about 0.5 percent to about 1.0 percent by weight, the conformal coating is sufficiently transparent (i.e., translucent) to permit inspection of the underlying structure, such as the solder joints. At higher concentrations of the conductive polymer above about 1.0 percent, the conformal coating becomes too opaque to permit such inspection.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 1 is a schematic sectional view of an electronic assembly;

FIG. 2 is a block flow diagram of an approach for practicing the invention;

DETAILED DESCRIPTION OF THE INVENTION

Figure 3:
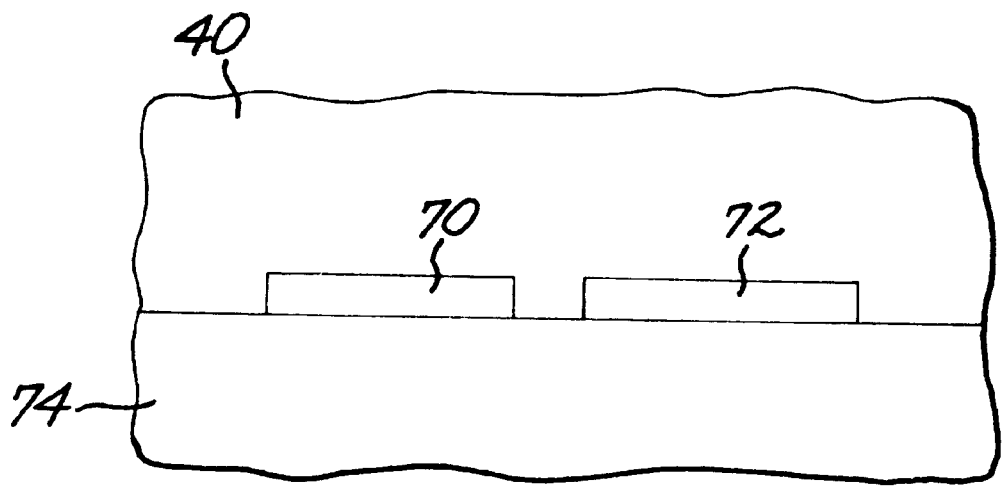
FIG. 3 is a greatly enlarged view of two adjacent electronic components coated by the conformal coating of the invention.

FIG. 1 depicts a structure which, according to a preferred embodiment, is an electronic assembly 20. The electronic assembly 20 includes a number of components, some examples of which are illustrated. Mounted on a printed wire board (PWB) 22, made of an insulator such as a phenolic resin, are a microelectronic device 24 shielded by a metallic shield 26 mounted on insulator 28; a microelectronic device 30 within a package 32 having an insulating base 34 and an ungrounded metallic lid 36; and two electrically conductive traces 38. Each of the PWB and the components have one or more external surfaces. Many other types of components may be present as part of the electronic assembly, and these components are discussed only by way of example. The present invention relates to the protection of these components with a conformal coating. The specific nature of the components does not form a part of the present invention, and the components themselves are known in the art.

The PWB 22 and the components 24–38 are covered and encapsulated by a conformal coating 40, which is applied to the surfaces of the coated components and overlies them. The conformal coating 40 may instead be selectively applied to one or more of the PWB and the components, but less than all of them. The conformal coating protects the encapsulated elements of structure. The thickness of the conformal coating 40 is not critical, but it is typically from about 0.003 inch to about 0.011 inch thick.

The conformal coating 40 is a blend of a base polymer and an electrically conductive polymer. The base polymer is any polymer material which is suitable for forming conformal coatings in the absence of the electrically conductive polymer. A preferred base polymer is polyurethane, but other operable base polymers include, for example, epoxy, silicone, acrylic, or a UV (ultraviolet) curable acrylated polyurethane. The ability to use such a wide variety of conformal-coating polymers and the retention of their protective functionality while modified to be conductive are important advantages of the invention.

The electrically conductive polymer is any polymer material that may be blended with the base polymer and is electrically conductive. A preferred electrically conductive polymer is a polyaniline such as an acid-doped polyaniline. The most preferred electrically conductive polymer is polyaniline-dodecyl benzene sulfonic acid, sometimes represented as PANI-DBSA. Other operable electrically conductive polymers include, for example, polypyrrole, polythiophene, polyacetylene, polyphenylene sulfide, and other types of aciddoped polyanilines (for example, polyaniline-camphor sulfonic acid and polyaniline-dinonylnaphthalene sulfonic acid).

The proportions of the base polymer and the electrically conductive polymer in the blend are such that the electrical resistivity of the final cured conformal coating 40 is from about $10^9$ to about $10^{13}$ ohm-centimeter. In a geosynchronous orbit of the earth, for an electronic box with a minimum of shielding the maximum electron current density at the components and the PWBs is expected to be less than about 100 pA/cm$^2$. Since this current is relatively small, the conformal coating 40 need not have extremely good electrical conductivity to bleed the current completely. Material with a resistivity of less than about $10^{13}$ ohm-centimeter is adequate. The electric field within the conductive conformal coating with this resistivity is expected to be two orders of magnitude lower than the minimum threshold electric field for breakdown to occur. If the electrical resistivity is greater than about $10^{13}$ ohm-centimeter, the conformal coating 40 has too little electrical conductivity. The conformal coating 40 will not provide a sufficiently conductive path to ground to bleed away static charges that are introduced into the conformal coating or onto the coated surfaces. The lower limit of resistivity is application specific and is determined by current-leakage requirements. If the electrical resistivity is less than about $10^9$ ohm-centimeter (for most applications and about $10^{10}$ ohm-centimeter for some other applications), parasitic current due to leakage through the conductive conformal coating causes degradation in circuit performance. The conformal coating 40 is too electrically conductive so that there may be electrically conductive paths between some of the coated components or between a coated component and some external object such as mounting brackets, chassis, and screws.

For most blends of available electrically conductive polymers and base polymers, the cured blend contains from about 0.5 percent to about 4 percent by weight of the electrically conductive polymer to achieve the required electrical resistivity of the conformal coating 40. A virtue of the present approach is that the electrical resistivity of the conformal coating 40 may be selectively established by the percentage of the electrically conductive polymer in the blend. Increasing amounts of the electrically conductive polymer lead to lower resistivities of the blend and thence of the conformal coating 40. A calibration may be prepared of the relation between electrical resistivity and percentage of electrically conductive polymer, from which the required percentage to achieve a desired electrical resistivity may be found. Conformal coatings with varying electrical resistivities may be used in specific applications and operating environments, and may even be used on different parts of the same structure.

At an electrically conductive polymer concentration of from about 0.5 percent to about 1.0 percent by weight of the conformal coating, the conformal coating is sufficiently transparent (i.e., translucent) to permit inspection of the underlying structure, such as the solder joints. At higher concentrations of the electrically conductive polymer above about 1.0 percent, the conformal coating becomes too opaque to permit such inspection. Thus, if the ability to perform visual inspection is important in a particular application, the concentration of the electrically conductive polymer may not exceed about 1.0 percent by weight of the conformal coating.

As electronic charge is deposited onto the components and PWB of the electronic assembly 20 in service, the charge is slowly conducted to ground through the partially conducting conformal coating 40. The electrical ground may be found through the coated PWB to its internal grounds, to grounds in the coated components, or to a separate grounding trace 42 deposited and left exposed on the PWB 22 for this purpose. At least some of the components, such as the shield 26, the insulator 28, and the package lid 36, typically would not have any other path by which the static charge at and around them could be reduced in a controllable fashion.

This draining or trickling of the static charge to ground prevents voltages from building up on the coated PWB 22 and the coated components 24–38 which might otherwise become large and cause arcs or other damage. Stated otherwise, the conformal coating 40 provides a controlled, gradual discharge of the static charge, preventing an uncontrolled discharge in the form of an arc that might damage the components or upset sensitive circuits such as by causing the switching of logic states.

FIG. 2 depicts a procedure for preparing the electronic assembly 20. The base polymer and the electrically conductive polymer are provided and then blended by any operable approach, numeral 60. To perform the blending in the preferred embodiment, PANI-DBSA powder is dispersed in a xylene solution by mixing with a high shear mixing device. The desired amount of the PANI-DBSA/xylene solution is added to the uncured resin of the base polymer and mixed well by vigorous shaking. The polymerization is catalyzed by the addition of the recommended amount (for the base polymer) of catalyst to the blended conductive polymer-base polymer resin.

The structure to be coated is provided, numeral 62. In the case illustrated in FIG. 1, the entire PWB 22 with assembled components 24–38 is provided. In other instances, individual parts of the structure may be coated.

The polymer blend is applied to the structure to be coated, numeral 64. Prior to curing, the polymer blend is a viscous liquid. The application is by any operable technique for such a viscous liquid, such as dipping, spraying, brushing, spin coating, screen printing, flow coating, and the like.

The coating is cured, numeral 66. The curing is preferably accomplished according to the procedure recommended for the base polymer. Because the proportion of the electrically conductive polymer is so small, its presence has little effect on the curing of the polymer blend. The curing is therefore dominated by the curing processes of the base polymer. In the case of the preferred polyanilinepolyurethane polymer blend, the curing is accomplished by a room temperature cure for 24 hours, an elevated temperature cure according to the recommendation for the base polymer, or an ultraviolet radiation cure if the base polymer is a UV-curable resin system.

Figure 4:
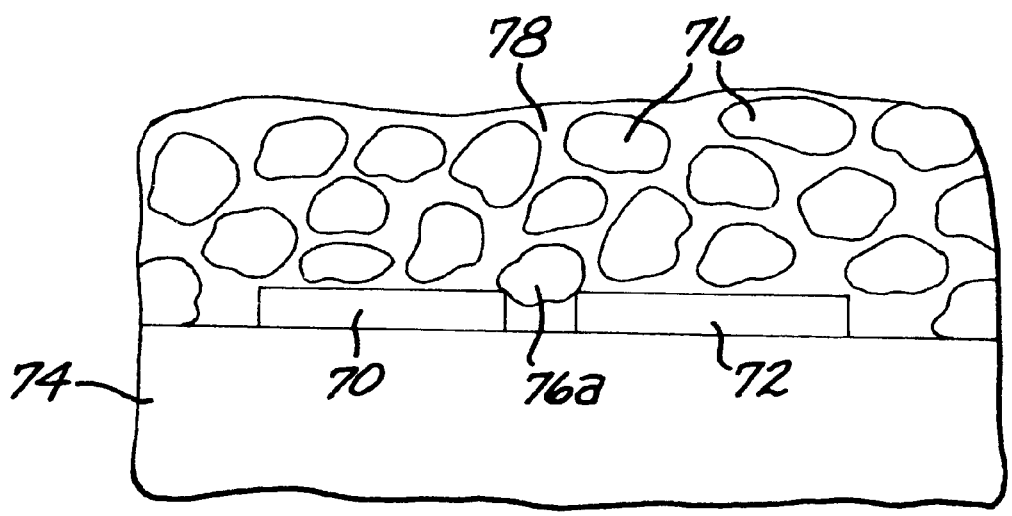
FIG. 4 is a greatly enlarged view of two adjacent electronic components coated by a particle-containing conformal coating.

FIGS. 3 and 4 illustrate an important advantage of the present conformal coating 40 over alternative approaches in which electrically conductive particles or fibers are embedded in a polymer matrix. FIGS. 3 and 4 are schematic, but are at a high magnification. FIG. 3 shows the present conformal coating 40 overlying two closely spaced electrical conductors 70 and 72 on a support 74. The polymer molecules of the electrically conductive polymer in the conformal coating are so small that they are not visible on this scale. In particular, the molecules of the electrically conductive polymer cannot bridge between the electrical conductors 70 and 72. FIG. 4 illustrates the same electrical conductors 70 and 72, in a case where electrically conductive particles 76 are embedded in a polymeric material 78. The approach associated with FIG. 4 is not within the scope of the present invention. A particular electrically conductive particle 76a has found its way to a position such that it contacts both of the electrical conductors 70 and 72. The result is that the electrically conductive particle 76a shorts the two electrical conductors 70 and 72, rendering the protected structure inoperable. Such a situation may occur in relation to the approach described in U.S. Pat. No. 5,160, 374, particularly if it is used with advancing microelectronic technologies where the spacings between electrical conductors are made ever smaller. The same problem arises if electrically conductive fibers or whiskers are used instead of the electrically conductive particles 76.

Figure 5:
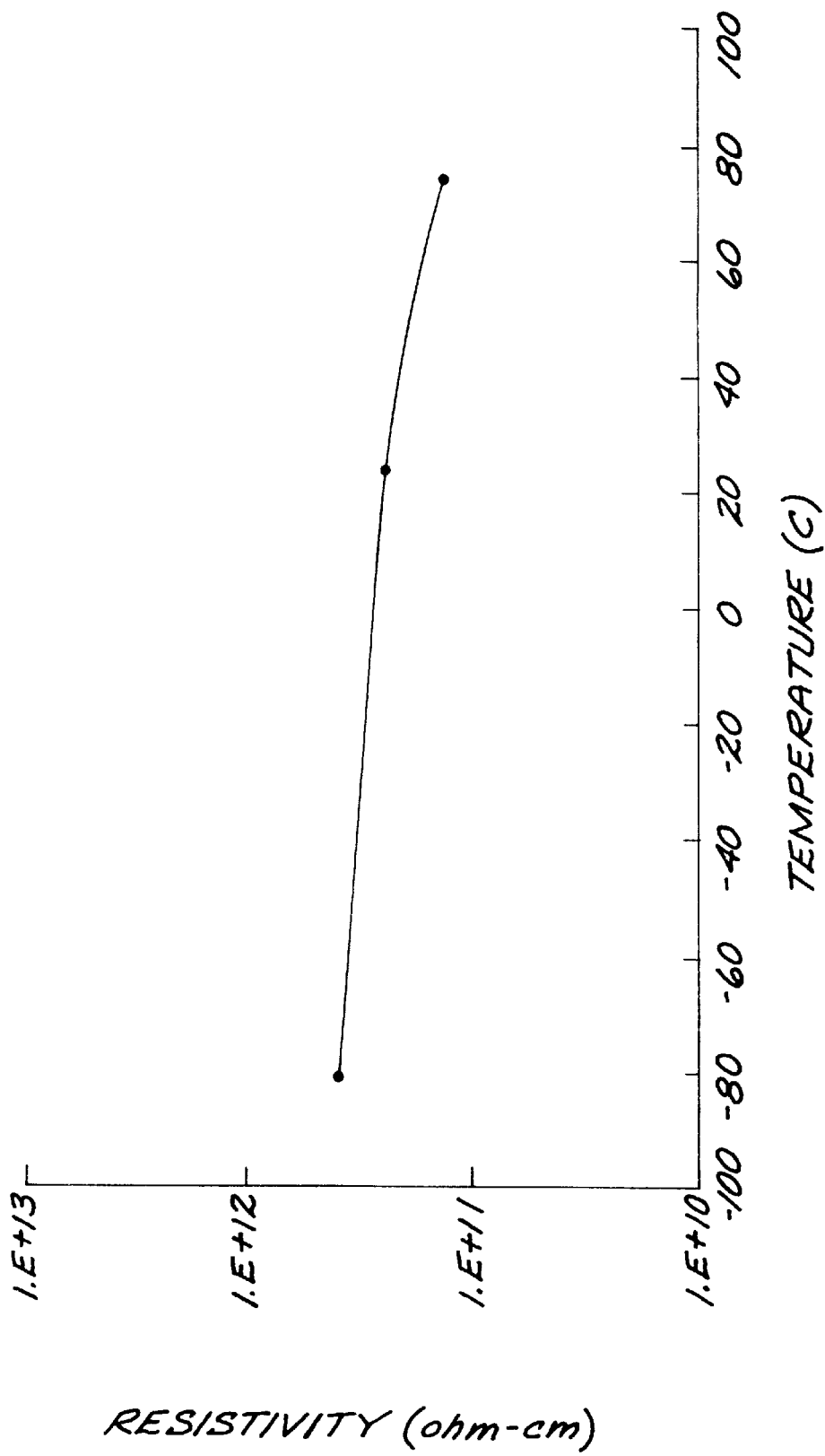
FIG. 5 is a graph of electrical resistivity of one conformal coating according to the invention as a function of temperature.

The present invention has been reduced to practice with a polymer blend containing 2 weight percent of PANI-DBSA in a polyurethane, specifically Urelane 5750-B resin and 5750-A curing agent. Processing was accomplished as described above. The electrical conductivity of the cured conformal coating was measured as a function of temperature, because protected structures in spacecraft are typically exposed to a range of temperatures. FIG. 5 presents the electrical resistivity as a function of temperature. The electrical resistivity is nearly constant over the temperature range of −80° C. to +80° C. The near constancy of electrical resistivity is an important feature of the invention, as discussed above, which cannot be achieved with particle-filled polymers.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A conformally coated structure, comprising:
   a structure comprising a microelectronic device; and a conformal coating applied to a surface of the structure, the conformal coating comprising a polymer blend of a base polymer and an electrically conductive polymer.

2. The conformably coated structure of claim 1, further including an electrical ground to the conformal coating.

3. The conformally coated structure of claim 1, wherein the conformal coating comprises a cured polymer blend.

4. The conformally coated structure of claim 1, wherein the electrically conductive polymer is a polyaniline.

5. The conformally coated structure of claim 1, wherein the base polymer is selected from the group consisting of a urethane, an epoxy, a silicone, and an acrylic.

6. The conformally coated structure of claim 1, wherein the polymer blend has an electrical resistivity of from about $10^9$ to about $10^{13}$ ohm-centimeter.

7. The conformally coated structure of claim 1, wherein the polymer blend contains from about 0.5 percent to about 4 percent by weight of the electrically conductive polymer, with the remainder comprising the base polymer.

8. A conformally coated structure, comprising:

a structure comprising a component of an electronic assembly; and a conformal coating applied to a surface of the structure, the conformal coating comprising a cured polymer blend of a base polymer and an electrically conductive polymer, wherein the polymer blend has an electrical resistivity of from about $10^9$ to about $10^{13}$ ohm-centimeter.

9. The conformally coated structure of claim 8, wherein the structure is selected from the group consisting of microelectronic device, a part of a package, and an electrically conductive trace.

10. The conformally coated structure of claim 8, wherein the electrically conductive polymer is a polyaniline.

11. The conformally coated structure of claim 8, wherein the electrically conductive polymer is acid-doped polyaniline.

12. The conformally coated structure of claim 8, wherein the base polymer is a urethane.

13. The conformally coated structure of claim 8, wherein the base polymer is a urethane and the electrically conductive polymer is a polyaniline.

14. The conformally coated structure of claim 8, wherein the polymer blend contains from about 0.5 percent to about 4 percent by weight of the electrically conductive polymer, with the remainder comprising the base polymer.

15. A conformally coated structure, comprising:

a structure comprising a component of an electronic assembly; and a conformal coating applied to a surface of the structure, the conformal coating comprising a cured polymer blend of a base polymer and an electrically conductive polymer, wherein the polymer blend contains from about 0.5 percent to about 4 percent by weight of the electrically conductive polymer, with the remainder comprising the base polymer.

16. The conformally coated structure of claim 15, wherein the structure is selected from the group consisting of microelectronic device, a part of a package, and an electrically conductive trace.

17. The conformally coated structure of claim 15, wherein the electrically conductive polymer is a polyaniline.

18. The conformally coated structure of claim 15, wherein the electrically conductive polymer is acid-doped polyaniline.

19. The conformally coated structure of claim 15, wherein the base polymer is a urethane.

20. The conformally coated structure of claim 15, wherein the polymer blend contains from about 0.5 percent to about 1.0 percent by weight of the electrically conductive polymer, with the remainder comprising the base polymer.

21. The conformably coated structure of claim 8, further including an electrical ground to the conformal coating.

22. The conformably coated structure of claim 15, further including an electrical ground to the conformal coating.

23. The conformably coated structure of claim 1, wherein the conformal coating has no electrically conductive particles therein.

24. The conformably coated structure of claim 8, wherein the conformal coating has no electrically conductive particles therein.

25. The conformably coated structure of claim 15, wherein the conformal coating has no electrically conductive particles therein.

* * * * *